United States Patent [19]
Chang et al.

[11] Patent Number: 5,412,384
[45] Date of Patent: May 2, 1995

[54] METHOD AND SYSTEM FOR ADAPTIVELY BUILDING A STATIC ZIV-LEMPEL DICTIONARY FOR DATABASE COMPRESSION

[75] Inventors: Chung-Chia Chang, San Jose; Gregory L. Davoll, Los Gatos; Mohamed H. El-Ruby, San Jose; Craig A. Friske, San Jose; Balakrishna R. Iyer, San Jose; John P. Lazarus, San Jose; David Wilhite, Los Angeles, all of Calif.; Kenneth E. Plambeck, Poughkeepsie, N.Y.

[73] Assignee: International Business Machines Corporation, Armonk, N.Y.

[21] Appl. No.: 288,675

[22] Filed: Aug. 10, 1994

Related U.S. Application Data

[63] Continuation of Ser. No. 48,820, Apr. 16, 1993, abandoned.

[51] Int. Cl.6 .............................................. H03M 7/38
[52] U.S. Cl. .......................................... 341/79; 341/51
[58] Field of Search .............................. 341/51, 67, 79

[56] References Cited

U.S. PATENT DOCUMENTS

| | | | |
|---|---|---|---|
| 4,464,650 | 8/1984 | Eastman et al. | 340/347 |
| 4,814,746 | 3/1989 | Miller et al. | 341/95 |
| 5,087,913 | 2/1992 | Eastman | 341/95 |
| 5,150,119 | 9/1992 | Yoshida et al. | 341/51 |
| 5,151,697 | 9/1992 | Bunton | 341/51 |
| 5,153,591 | 10/1992 | Clark | 341/51 |

FOREIGN PATENT DOCUMENTS 0350281 4/1989 European Pat. Off. ...... H03M 7/40

OTHER PUBLICATIONS

Terry A. Welch, "A technique for High-Performance Data Compression", *Computer*, Jun. 1984, pp. 8–19.

Victor S. Miller, Mark N. Wegman, "Variations on a Theme by Ziv and Lempel", Research Report/Computer Science, Jul. 31, 1984, 11 pages.

Glen G. Langdon, Jr., "A note on the Ziv–Lempel Model for Compressing Individual Sequences", *IEEE Transactions on Information Theory*, vol. IT-29, No. 2, Mar. 1983, pp. 284–287.

Jacob Ziv, Abraham Lempel, "Compression of Individual Sequences via Variable-Rate Coding", *IEEE Transactions on Information Theory*, vol. IT-24, No. 5, Sep. 1978, pp. 530–536.

Kent Anderson, "Methods of Data Compression after the Manner of Lempel and Ziv", *Optical Information Systems*, Jan.–Feb. 1990, pp. 40–43.

*Primary Examiner*—Marc S. Hoff
*Attorney, Agent, or Firm*—Baker, Maxham, Jester & Meador

[57] ABSTRACT

A system for creating a static data compression dictionary adapted to a hardware-based data compression architecture. A static Ziv-Lempel dictionary is created and stored in memory for use in compressing database records. No data compression occurs during dictionary construction. A fixed-size Ziv-Lempel parse-tree is adapted to database characteristics in one of two alternate ways. First, the parse-tree is overbuilt substantially and then pruned back to a static size by eliminating the least recently used (LRU) nodes having the lowest use count. Alternatively, the parse-tree is built to a static size and thereafter selected nodes are replaced with new nodes upon database sampling. This node recycling procedure chooses the least-useful nodes for replacement according to a use count and LRU strategy while exhausting the database sample. The pruned Ziv-Lempel parse-tree is then transformed to a static dictionary configuration and stored in memory for use in a hardware-based database compression procedure. Completion of the static dictionary before starting data compression eliminates the initial compression inefficiencies well-known for the Ziv-Lempel procedure. The parse-tree construction is enhanced by initializing the tree with NULL and DEFAULT sequences from database definitions before examining any data.

12 Claims, 6 Drawing Sheets

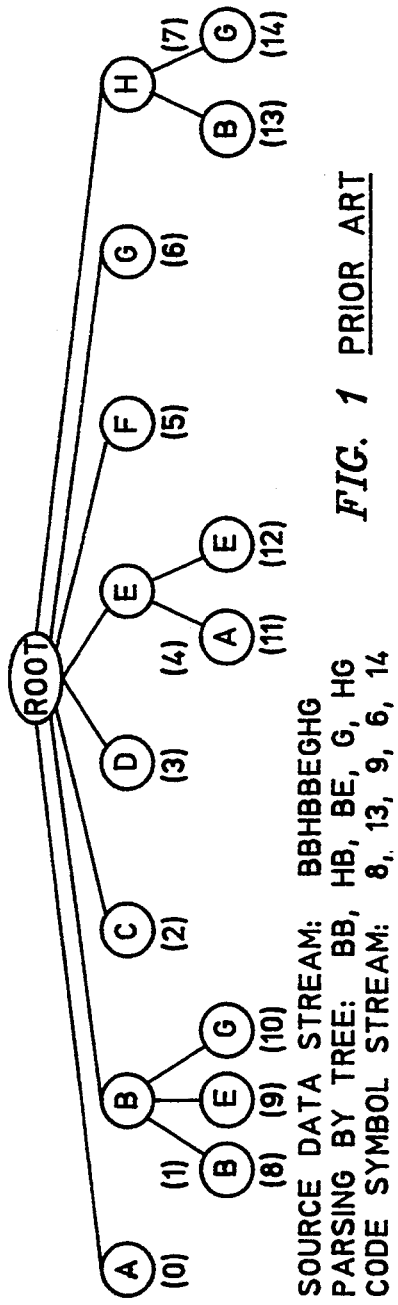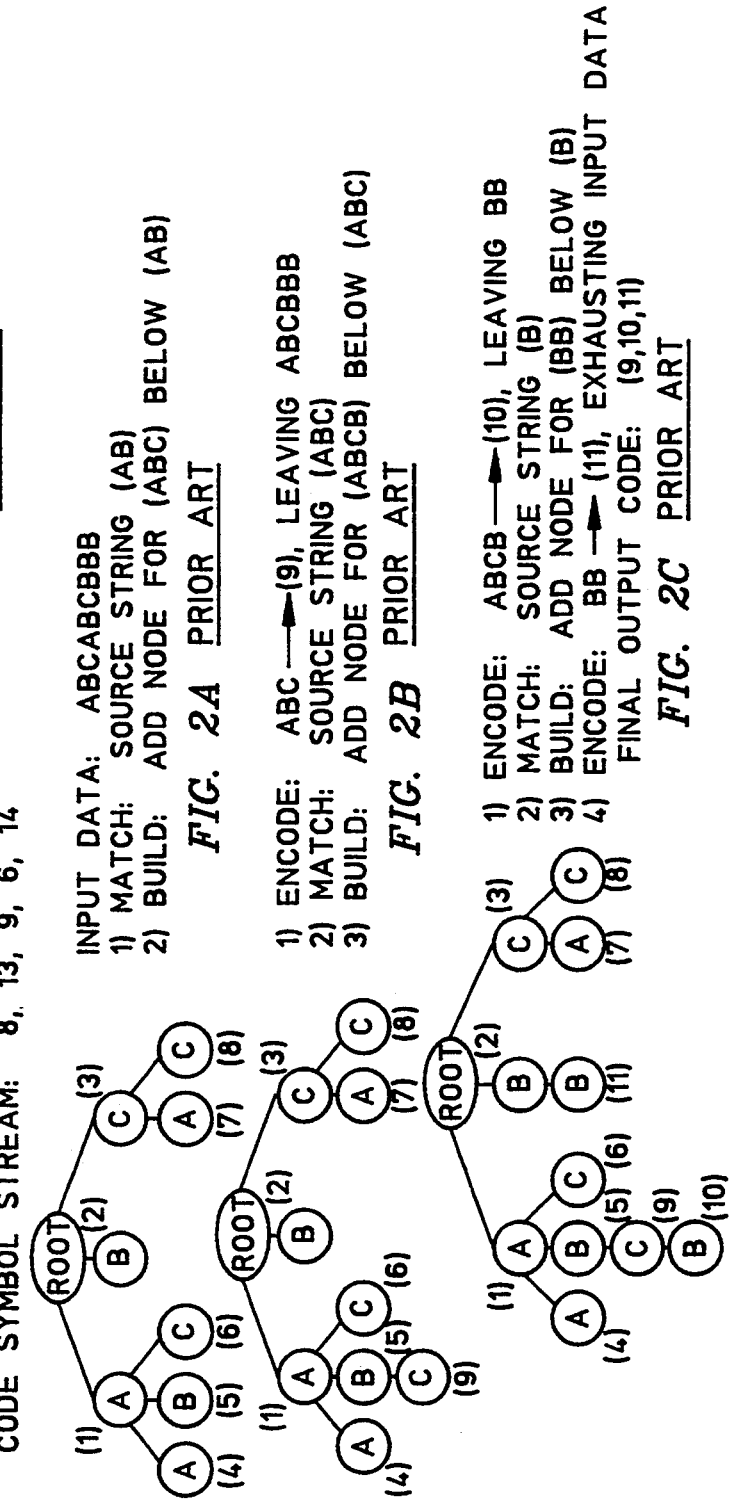

ENCODING PROCESS

DECODING PROCESS

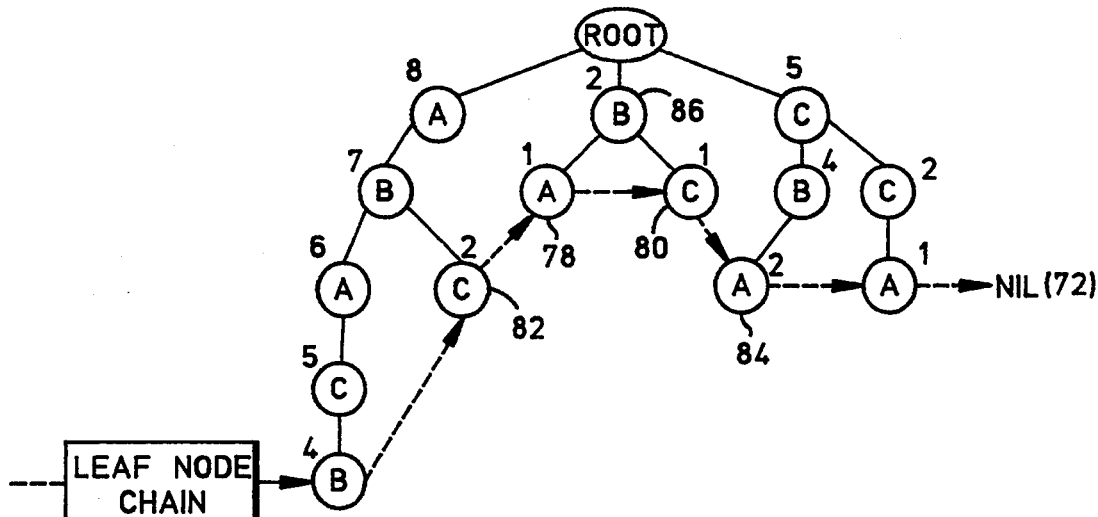
*FIG. 7A: OVERBUILD TO 14 NODES.*
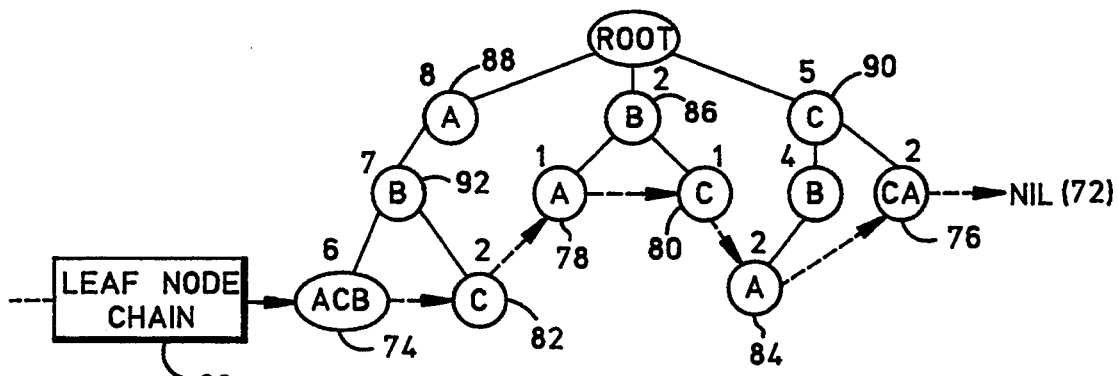
*FIG. 7B: COMBINE TO 11 NODES.*
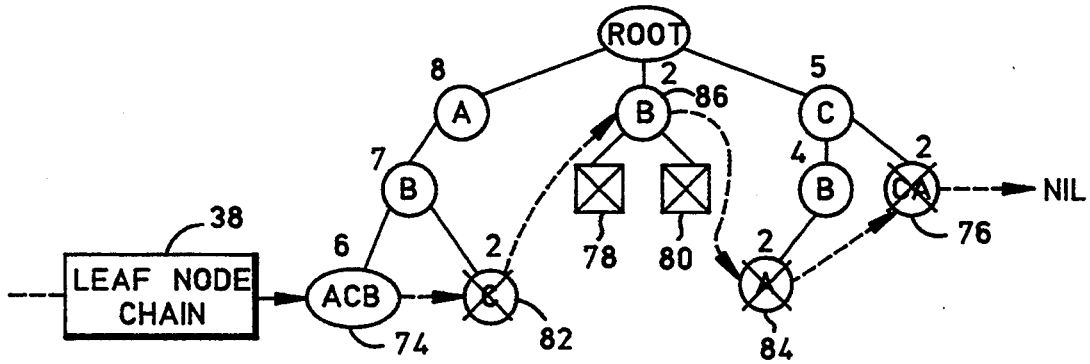
*FIG. 7C: PRUNE TO 9 (OR 6) NODES.*

METHOD AND SYSTEM FOR ADAPTIVELY BUILDING A STATIC ZIV-LEMPEL DICTIONARY FOR DATABASE COMPRESSION

CROSS-REFERENCE TO RELATED APPLICATIONS

This is a 37 CFR 1.53 continuation of parent application Ser. No. 08/048,820 filed on Apr. 16, 1993, now abandoned.

BACKGROUND OF THE INVENTION

1. Field of the Invention

This invention relates to computer-implemented systems for adaptive compression of data and, more specifically, to a system for building a static compression dictionary which can be used for software or hardware compression procedures.

2. Discussion of the Related Art

For many years, data compression has been implemented as a host software task. Recently, there has been a trend toward implementing hardware data compression, especially within data storage subsystems and devices. This strategy reduces the host workload and increases effective storage capacity and transfer rate. Increases in VLSI density and continuing improvement of sophisticated data compression procedures that automatically adapt to different data have encouraged this trend.

The problems presented by data compression procedures include the difficulties with updating adaptive dictionaries and the processor overhead associated with developing and adapting such a dictionary over time. Practitioners in the art have proposed powerful adaptive compression procedures, such as the Ziv-Lempel adaptive parse-tree, for compressing data and for evolving the code dictionary responsive to data characteristics.

The Ziv-Lempel algorithm was first described by Ziv, et al ("A Universal Algorithm For Sequential Data Compression", IEEE Trans. Info. Theory, IT-23, No. 3, pp. 337-343, May 1977). The basic Ziv-Lempel encoder has a code dictionary in which each source sequence entry has an associated index (code) number. Initially, the dictionary contains only the null-string root and perhaps the basic source alphabet. During the source data encoding process, new dictionary entries are formed by appending single source symbols to existing dictionary entries whenever the new entry is encountered in the source data stream. The dictionary can be considered as a search tree or parse-tree of linked nodes, which form paths representing source symbol sequences making up an "extended"source alphabet. Each node within the parse-tree terminates a source symbol sequence that begins at the null-string root node of the tree. The source data stream is compressed by first recognizing sequences of source symbols in the uncompressed input data that correspond to nodes in the parse-tree and then transmitting the index (code symbol) of a memory location corresponding to the matched node. A decoder dictionary is typically constructed from the parse-tree to recover the compressed source sequence in its original form. The Ziv-Lempel parse-tree continuously grows during the encoding process as additional and increasingly lengthier sequences of source symbols are identified in the source data stream, thereby both adapting to the input data character and steadily improving the compression ratio.

The ideal Ziv-Lempel compression procedure is difficult to implement in practice because it requires an indefinitely large memory to store the parse-tree. Practitioners have introduced data structures designed to ease this problem, including the "TRIE" structure discussed by Kent Anderson ("Methods of Data Compression After The Manner of Lempel and Ziv", Optical Information Systems, January-February 1990). Terry A. Welch ("A Technique For Higher Performance Data Compression", IEEE Computer, Vol. 17, No. 6, pp. 8-19, June 1984) discusses data structures that improve the efficiency of the basic Ziv-Lempel technique, trading off compression efficiency for simplified implementation. Also, in U.S. Pat. No. 4,814,746, Victor S. Miller, et al disclose a variation on the Ziv-Lempel data compression method that improves compression efficiency using a fixed parse-tree size. However, the Miller, et al method employs a hash table that requires significant memory and processing time, thereby negating much of the speed advantage sought with hardware-based dictionaries.

The related art is generally documented by other practitioners and can be clearly understood with reference to Allen Clark's disclosure in European Patent Application 89306808.0 published on Jan. 10, 1990. Also, reference is made to Willard Eastman's disclosure in U.S. Pat. No. 5,087,913, which extends his earlier work disclosed in U.S. Pat. No. 4,464,650, and Terry Welch's disclosure in U.S. Pat. No. 4,558,302, all of which are entirely incorporated herein by this reference.

A fundamental problem presented by hardware-based compression systems is how to best exploit the speed advantage of hardware encoders and decoders while enjoying the compression efficiency offered by the Ziv-Lempel class of dictionaries. The parse-tree data structures proposed by Clark, Miller et al and Welch in the above-cited references offer some improvement in encoding and decoding speed but are generally intended for software implementation. Also, the Ziv-Lempel technique generally relies on continuing adaptation of the parse-tree responsive to an incoming source data stream, so the resulting dictionary must be continuously updated by software processes, a wasteful procedure for hardware-based systems.

Several practitioners, particularly Miller, et al cited above, have also considered the problem of poor compression efficiency during the early tree-building process. The Ziv-Lempel parse-tree is initialized either with the null-string root node alone or with the root node and a single set of source alphabet child-nodes. The initial parse-tree has only this inefficient dictionary with which to encode the early portion of the input data stream. Ziv, et al cited above showed that this early inefficiency is inconsequential over the long term. However, in databases where the input data stream consists of a series of individually-encoded records of relatively short length, Miller, et al cited above argue that up to one-third of the entire data stream can require more storage space in its encoded form than in its original form.

Consider, for example, that the very first 8-bit source symbols must be encoded as 12-bit encoder symbols in a parse-tree designed for Variable-to-Fixed (V–F) encoding of up to 4K extended-alphabet source symbols. If the parse-tree is restarted at the beginning of each record and the record is not long enough to eventually overcome the early parse-tree inefficiency by adding longer source symbol strings for conversion to single 12-bit encoder symbols, the encoded data may well require more storage space than does the source data.

Another problem presented by implementation of the Ziv-Lempel parse-tree is memory space limitations. In the above-cited patent, Miller, et al discuss the use of a replacement procedure that updates the dictionary responsive to recent samples of the source data stream without overflowing a fixed dictionary size. They test the dictionary for an empty slot and delete the least recently used (LRU) source-symbol string from the dictionary if no empty slot is found. Unfortunately, a simple LRU replacement scheme may eliminate an entry that was used many times, although not recently.

Implicit in such a replacement procedure is the understanding that both the encoder and decoder dictionaries are updated simultaneously in accordance with the modified parse-tree and that any data already encoded by the deleted entry is no longer in existence, having already been decoded. This is suitably assumed in a communication channel but is not likely in a database storage system. Miller, et al ("Variations On A Theme by Ziv and Lempel", Combinatorial Algorithms, A. Apostolico, et al, Eds., pp. 131-140, Springer Verlag, 19847) suggest that maintaining the parse-tree and dictionary data structures can be difficult when nodes and strings are to be deleted using the LRU strategy.

Thus, there exists a need in the art for an optimal strategy for creating a Ziv-Lempel dictionary adapted to the source data that can be stored for use in a hardware system for compressing data rabies of the type employed by database systems such as the International Business Machines Corporation Database 2. The related unresolved problems and deficiencies are clearly felt in the art and are solved by this invention in the manner described below.

SUMMARY OF THE INVENTION

The method of this invention solves the above problem by building a parse-tree using several improvements to the Ziv-Lemnel compression procedure known in the art and then freezing the tree to form a static dictionary for all of the data compression. It is an object of this invention to provide a method for building a static Ziv-Lempel dictionary suitable for use in compressing database tables having certain defined properties and other variable characteristics. The method of this invention meets this objective by building and freezing the static dictionary before performing any compression or decompression.

It is another object of this invention to provide a static Ziv-Lempel dictionary that can be stored for use in a hardware-based compression apparatus. It is yet another object of this invention to provide a method for building such fixed dictionary responsive to the peculiar characteristics of the database tables for which the dictionary is to be used. The method of this invention meets these objectives by first building the static Ziv-Lempel dictionary with reference to the peculiar database stream reflecting actual data table characteristics and then freezing it for use in compressing data tables from the same database. This invention arises from recognition that database table compression characteristics unexpectedly evolve slowly if at all over time, permitting beneficial use of a static compression dictionary without frequent updates.

It is another object of this invention to provide a method for limiting dictionary size without losing the Ziv-Lempel capability for adapting the dictionary to the data characteristics. The method of this invention meets this objective in two different ways. First, with an alternate method for building the parse-tree to a first larger size and then combining and/or pruning the tree back to the fixed size specified for the static Ziv-Lempel dictionary. Secondly, with an alternate method for building the parse-tree to the fixed size specified and then occasionally updating the tree through periodic database source stream sampling with parse-tree node recycling. Both methods are preferred, depending on the particular database application.

It is yet another object of this invention to provide an efficient parse-tree initialization technique that exploits predetermined data table properties. This objective is met by selecting predetermined "DEFAULT" and "NULL" definitions for the data table as initial entries in the parse-tree. The Ziv-Lempel parse-tree is initialized with these NULL and DEFAULT strings in addition to the usual source symbol alphabet node set linked to the root node. It is an advantage of this method that the processing overhead required to build the tree is thereby reduced substantially.

It is yet another advantage of the method of this invention that, by building and freezing the static Ziv-Lempel dictionary required for the encoding and decoding procedures before compressing any data, the entire static dictionary is available at the beginning of the data stream, thereby avoiding the well-known initial compression inefficiency of the Ziv-Lempel technique.

The foregoing, together with other objects, features and advantages of this invention, will become more apparent when referring to the following specification, claims and the accompanying drawing.

BRIEF DESCRIPTION OF THE DRAWINGS

For a more complete understanding of this invention, reference is now made to the following detailed description of the embodiments as illustrated in the accompanying drawing, wherein:

FIG. 1 provides an example of a Ziv-Lempel parse-tree from the prior art;

FIG. 2, comprising FIGS. 2A-C, shows an example of the evolution of a Ziv-Lempel tree from the prior art;

FIG. 5, comprising

FIG. 6, comprising

FIG. 7, comprising FIGS. 7A-C, illustrates the node combining and pruning procedure of this invention; and FIG. 8, comprising

DETAILED DESCRIPTION OF THE PREFERRED EMBODIMENTS

The Ziv-Lempel Parse-Tree

Figure 3:
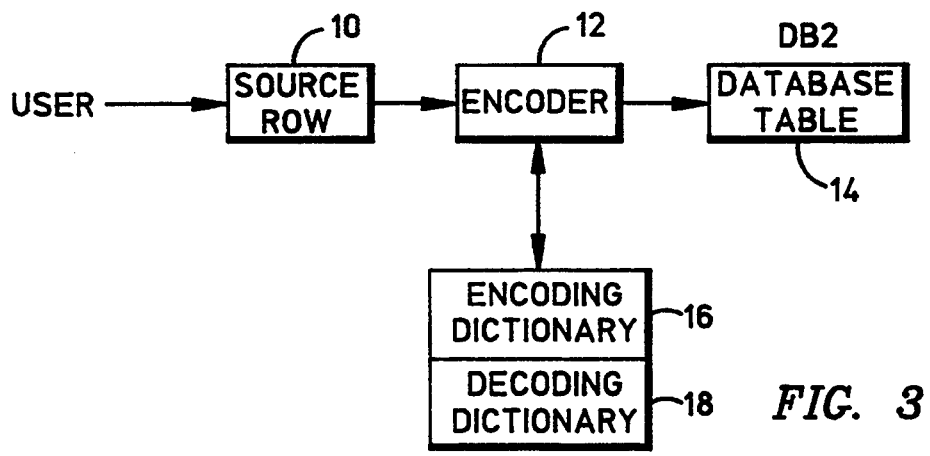
FIG. 3 shows a functional block diagram of the encoder of this invention.

FIG. 1 provides an illustration of the Ziv-Lempel parse-tree known in the art. The tree has been initiated with a complete source alphabet, assumed to be the eight letters (A, B, C, D, E, F, G, H). In addition, child nodes are provided extending from alphabet nodes B, E and H. In the art, a typical tree includes thousands of such progeny nodes. In the example in FIG. 1, all nodes are assigned a code symbol shown as a numeral in parentheses ranging from (0) to (14). A source string is encoded by parsing it against the sequences or paths in the parse-tree and replacing the source symbol string with the single code symbol assigned to the node corresponding to the end of the source symbol string.

In the above-cited Ziv, et al reference, the compression procedure was first specified as starting from the null string root node alone. Later, in the above-cited Welch reference, Welch modified this tree-priming procedure by initializing the parse-tree with all of the source symbol alphabet nodes, (A-H) in FIG. 1 and (A-C) in FIGS. 2A-2C. As exemplified by the above-cited Miller, et al reference, others have adopted useful initialization strategies for the Ziv-Lempel parse-tree. These tree-priming strategies are useful because the input data stream is compressed using the parse-tree thus far created during construction, but a useful method for string-priming or phrase-priming of the parse-tree was unknown until now. The decoder and encoder dictionaries are built from the same source to ensure lossless compression.

FIGS. 2A-C illustrate the Ziv-Lempel parse-tree construction process. In FIG. 2A, the tree is shown as it exists thus far, having the root node and eight progeny nodes, including three source-symbol alphabet nodes. The encoder is, for example, presented with input data stream ABCABCBBB. Only the first two source symbols AB are matched in the existing parse-tree. This match is followed by the creation of a new node and the encoding of a three-symbol string ABC with the code symbol (9) assigned to the new node, as shown in FIG. 2B. The remaining source data stream is next tested and a match is found for ABC. Responsive to this match, a new node is added to the tree representing AB CB and is assigned code symbol (10 ). Finally, the remaining source string is tested and matched for source symbol B and a new node (11) is added to complete the encoding of BB, as shown in FIG. 2C. Note that the parse-tree in FIG. 2C includes eleven progeny nodes instead of eight and that the nodes are positioned responsive to the characteristics of the input data stream.

It is worthy of note that the "leaf" nodes, that is, those childless nodes at the ends of the source-symbol sequences represented in the parse-tree, are the only nodes requiring encoder symbol assignments when encoding an infinite source data stream. However, in general, the source data stream terminates at the end of a record or at the end of a file. Because input data stream termination may fall on one of the intermediate parent nodes, encoder symbols are assigned to all nodes within the parse-tree.

Application of the Parse-Tree to Database Compression

Because the method of this invention first completes the parse-tree and dictionaries before coding any data, the related compression efficiency issues are thereby solved. Once the dictionaries are complete, the database encoding and decoding processes proceed in accordance with the simple functional illustrations shown in FIGS. 3 and 4, wherein it is assumed that the database, such as DB2, includes database tables having rows and columns stored in compressed form. In an example shown in FIG. 3, a user adds a row of data to the system. This row is denominated a source row 10. Source row 10 is presented to the encoder 12, wherein a sequence of code symbols is generated and forwarded to the database table 14 in a database system as the type represented, for example, by the DB2 system available from the IBM Corporation, Armonk, New York. Encoder 12 requires access to the encoding dictionary 16 to determine the appropriate sequence of encoder symbols. The decoding dictionary 18 is also shown in FIG. 3 because it contains overflow entries from the compression dictionary that may be used during the compression process. However, with the method of this invention, contents of both dictionaries 16 and 18 are frozen before any data compression activity.

Figure 4:
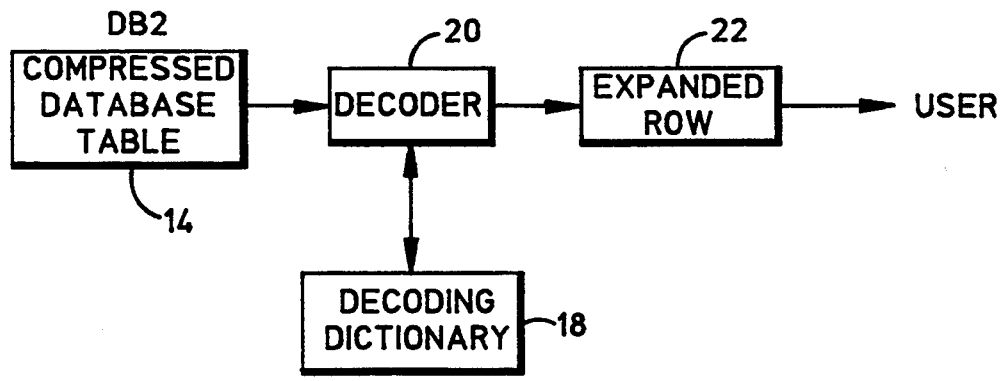
FIG. 4 shows a functional block diagram of the decoder of this invention.

Similarly, in FIG. 4, a user desires access to the source symbol version of a row within compressed data table 14. This row, in compressed form, is presented to the decoder 20 and the corresponding source-symbol sequence is forwarded to the user as the expanded (source) row 10. Decoder 20 requires access to decoding dictionary 18 to determine the appropriate source-symbol sequences. The method of this invention is presented and discussed herein in the context of a database system, such as International Business Machines Corporation Database 2, for illustrative purposes only. The general teachings have broad application to any system for which a hardware-based static compression dictionary is useful, such as a cellular data communications channel or a local area network.

Figure 8A:
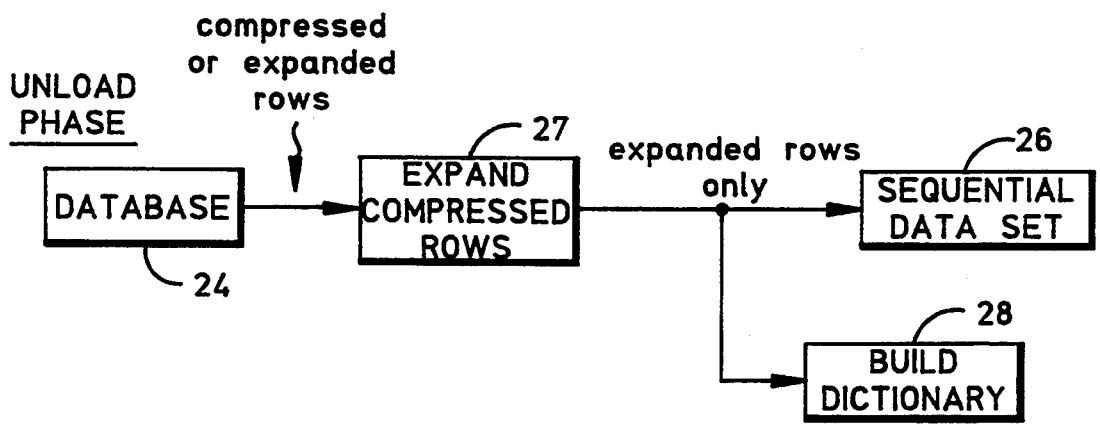
FIGS. 8A-C, shows simple functional block diagrams of two alternate dictionary building methods of this invention.
Figure 8B:
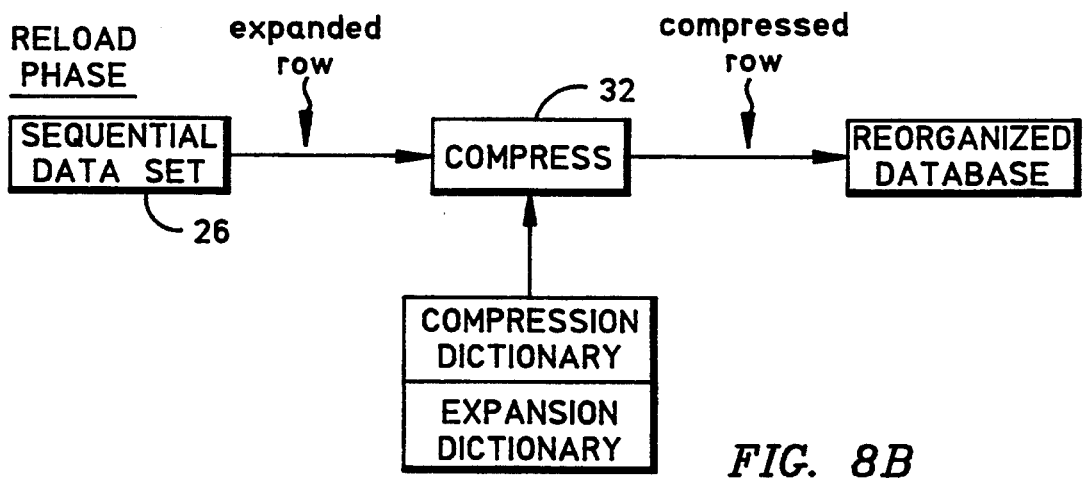
Figure 8C:
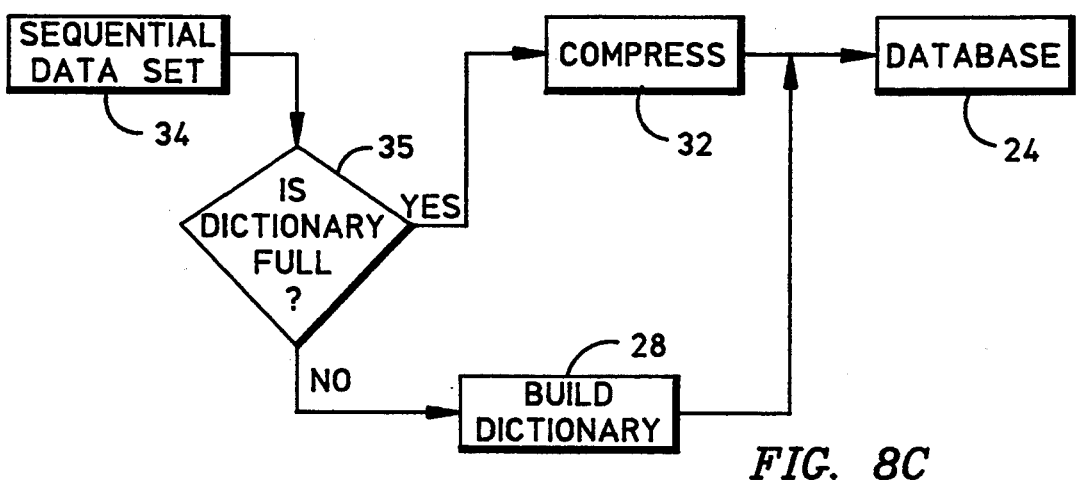

FIGS. 8A-8C illustrate sequences of (a) dictionary construction and (b) database compression for which the method of this invention is preferred. In this example, a dictionary is built with the DB2 LOAD or DB2 REORG Utility. In both cases, the dictionary is frozen before compression begins. The DB2 dictionary is not adaptive and its structure does not change after the process of data compression has started.

In FIG. 8A, the DB2 REORG utility begins by unloading the database 24 into a sequential data set 26. This is called the UNLOAD phase of the data reorganization procedure. The static dictionary is built by scanning the first n rows encountered by a build dictionary utility 28 during the UNLOAD phase. The value of variable n is the number of source symbol data table rows required to fill the dictionary. Once a dictionary is full, build dictionary utility 28 continues to sample rows from database 24 during their transfer to sequential data set 26. This sampling process is conducted at a varying rate for the remainder of the UNLOAD phase of the reorganization procedure. Thus, the dictionary is built until full and then a selected fraction of the remaining rows in database 24 are scanned to provide some representation of the later data in the final static dictionary. Because the dictionary is built during the UNLOAD phase, it is complete and frozen by the time the database rows are loaded back into the reorganized database 30 during the RELOAD phase of the reorganization procedure illustrated in FIG. 8B. As shown in FIG. 8B, every row contained in the sequential data set 26 is compressed by the compress utility 32 as it is reloaded into database 30. The strategy behind the process shown in FIG. 8A arises from the notion that a user should update his dictionary to reflect the presumably new characteristics of the database.

FIG. 8C provides an example based on the DB2 LOAD utility, which loads a sequential data set 34 into the DB2 database 24. The LOAD operation differs from the REORG operation in that sequential data set 34 presumably exists outside the DB2 database. As a tactic to prevent scanning the input data twice, once to build the dictionary and again to load the records, the method illustrated in FIG. 8C builds the dictionary until it is full. When full, the dictionary is immediately frozen and data compression immediately begins. This means that the first n rows of sequential data set 34 are loaded into database 24 as uncompressed source symbol sequences. When the dictionary is full, a decision logic 35 switches the source data stream from build dictionary utility 28 to compress utility 32 and the data compression process proceeds for the remainder of sequential data set 34. The primary difference from FIG. 8A is that the final dictionary does not reflect sampling of sequential data set 34 after the first n rows. Thus, the dictionary from FIG. 8C is presumably somewhat less efficient than the dictionary constructed according to FIGS. 8A and 8B. This slight loss of efficiency is the price for avoiding a second scan of the entire sequential data set 34.

This invention includes a method for building the parse-tree responsive to the input data stream from either sequential data set 34 or database 24 and a method for transformation of the parse-tree into a specified hardware-based format. The method used for building the tree includes several improvements to the Ziv-Lempel tree construction process known in the art. These improvements are (a) phrase-priming of the parse-tree, (b) leaf-node recycling in a static parse-tree, (c) parse-tree reduction through leaf-node combination, and (d) parse-tree reduction through leaf-node pruning.

Parse-Tree Initialization by Phrase-Priming

The initialization of a parse-tree with a single generation of source-symbol alphabet nodes is disclosed in the above-cited references by Welch and Miller et al. The method of this invention improves on the art by teaching a method for initializing the tree with phrases or source-symbol sequences that are a priori known as likely to frequently occur in the input data stream. Such sequences must be specified before examining any source data according to this invention. In specific DB2 terms, the parse-tree is primed with DB2 DEFAULT and NULL sequences that are found by examining the DB 2 table definition. These DEFAULT and NULL sequences can be inserted in the parse-table before any of the sequential data set is examined because the necessary source-symbol sequences are available in the DB2 table definition structure.

The DB2 LOAD utility loads data from sequential files into DB2 tables (FIG. 8C). It is possible to load specific columns in the table and to ignore others when loading data for NULLABLE columns. NULLABLE columns include columns defined as NOT NULL WITH DEFAULT as well as the NULL definition. When a row is loaded, any column with an unspecified value assumes the NULL value or the DEFAULT for that data type. This implies that in a NULLABLE column of a table, a large number of identical DEFAULT or NULL values will be found. This expected redundancy can immediately improve compression efficiency if the parse-tree table is initialized accordingly.

The Ziv-Lempel tree building methods known in the art would eventually detect this redundancy after analyzing many rows containing the NULL or DEFAULT string and the NULL or DEFAULT values would eventually appear in the dictionary. However, this approach forces the analysis of all NULL or DEFAULT rows by the tree building routine which in turn consumes extensive processing resources that are unnecessary with the method of this invention.

This method avoids this extensive processing overhead by peeking at the table definition before the loading begins. The table definition is stored in the DB2 CATALOG. The LOAD utility calls build dictionary utility 28 with a list of fields that should appear in the dictionary (FIGS. 8A–C). Build dictionary utility 28 then allocates a node for each NULL or DEFAULT value. A string of nodes is established to represent each source-symbol in the sequences corresponding to these values. These nodes are then attached to the tree below the appropriate alphabet node and are marked as being nonreplaceable. The nonreplaeeability guarantees their presence in the final dictionary, similar to the alphabet node treatment of the method of this invention. Alphabet nodes linked directly to the root node are also initialized in the tree as nonreplaceable.

As an aside, the most important processing overhead reduction arises from allowing the LOAD utility to skip build dictionary routine 28 whenever the DEFAULT or NULL fields are encountered. This avoids the repetitive scanning of identical fields during construction. Compression efficiency also benefits because the NULL and DEFAULT values always appear in the tree.

When tables have many columns with the identical type designation, the longest column is used to initialize the parse-tree because the shorter NULL or DEFAULT field is a subset of the longer NULL or DEFAULT field for the same type. An example of this is the LOAD of a table containing four columns from data containing only two columns, where the remaining two columns take NULL or DEFAULT values. The method of this invention initializes the Ziv-Lempel tree with the DEFAULT or NULL values so that they need not be processed during the dictionary building procedure. This initialization method also includes initializing the tree with the a priori definitions of conditional clauses such as DEFAULTIF and NULLIF used by the DB2 LOAD utility.

Leaf-Node Recycling In A Static Parse-Tree

The parse-tree is an n-way bounded tree with a maximum of N nodes. The tree is full when all N nodes have been filled with information. As mentioned above in connection with FIGS. 8A–C, the tree-full condition signals the LOAD utility to begin compression. In the REORG situation (FIGS. 8A and 8B), this is the signal that begins further sampling. The data set sampling procedure relies on a method for eliminating an existing parse-tree node so that a new node may be added. This procedure is denominated herein as leaf-node recycling. Node recycling is necessary because the tree cannot grow unbounded.

The method of this invention employs a procedure for choosing a node for replacement that relies on a combination of least recently used (LRU) and least frequently used (LFU) node measures. The combination of these two measures results in a class of node recycling procedures that is now described.

The First Leaf Encountered, Annihilated Sometimes (FLEAS) procedure is preferred for node recycling. During initialization of the parse-tree, all of the empty nodes remaining after priming the tree with alphabet nodes and NULL and DEFAULT nodes are placed in a free node chain. As the ADD NODE function is performed, new nodes are added to the parse-tree. When a node is added to the tree, the node at the beginning of the free-node chain becomes the new added tree node, which is assigned a use count value of one and linked to the end of a LRU chain. Everytime a node is matched during the build dictionary process, that node's use count value is incremented by one and maintained at the new value and the node is moved to the end of the LRU chain.

Thus, each node in the parse-tree contains a use count value that represents the number of times that the node has been encountered or matched during the tree building process. After the free-node chain is exhausted, the FLEAS method searches through the LRU chain from the beginning until it reaches a node having no children, which is herein denominated a leaf-node. The first leaf-node with a use count value equal to one is chosen to be recycled; that is, it is discarded to reduce the parse-tree size by the one node necessary to permit addition of a new node based on recent input data scanning. If there are no leaf-nodes found with a use count value of one on the first pass, then a second pass is made to locate the first leaf node having the lowest use count value encountered during the first pass. This "lowest count encountered" strategy avoids repeated passes that might be necessary if the use count value threshold is merely incremented by one after each pass.

When recycling a node, the LRU chain is traversed from the beginning and the leaf node of use count one is the target of a linked list search. This is a simple method but is sufficient to provide the REORG utility with a means for adding additional nodes during the sampling portion of the database scan, with the associated increase in compression efficiency. This procedure can be appreciated with reference to the example provided in FIGS. 6A–B.

Figure 6A:
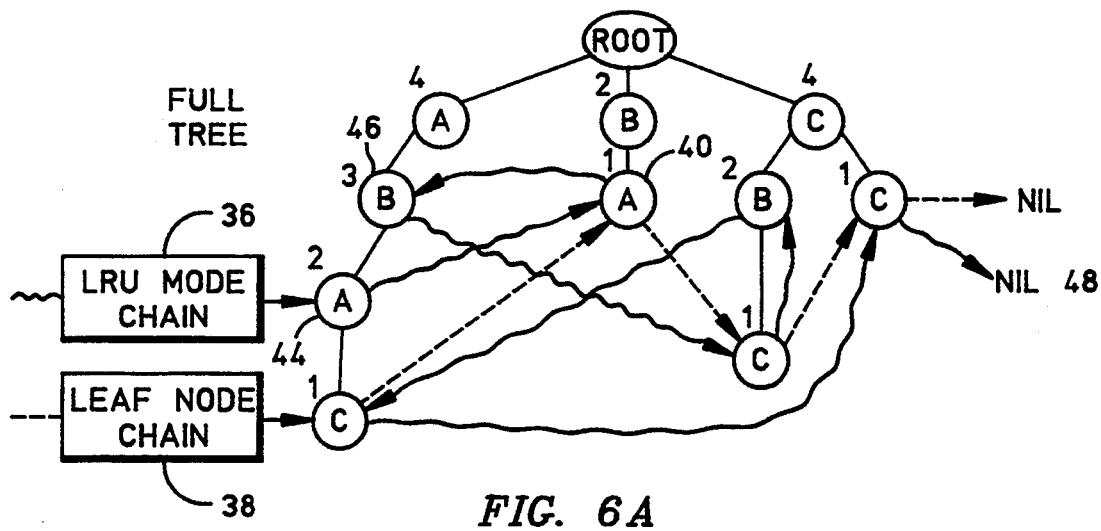
FIGS. 6A-B, illustrates the node recycling method of this invention.

FIG. 6A shows an initial full parse-tree having ten nodes. Each of the nodes is labelled with a use count value shown as a numeral next to the circular node symbol. An associated source symbol is shown on the interior of each node symbol. The LRU node chain 36 is shown as a concatenation of nodes connected by wavy lines with arrows.

Figure 6B:
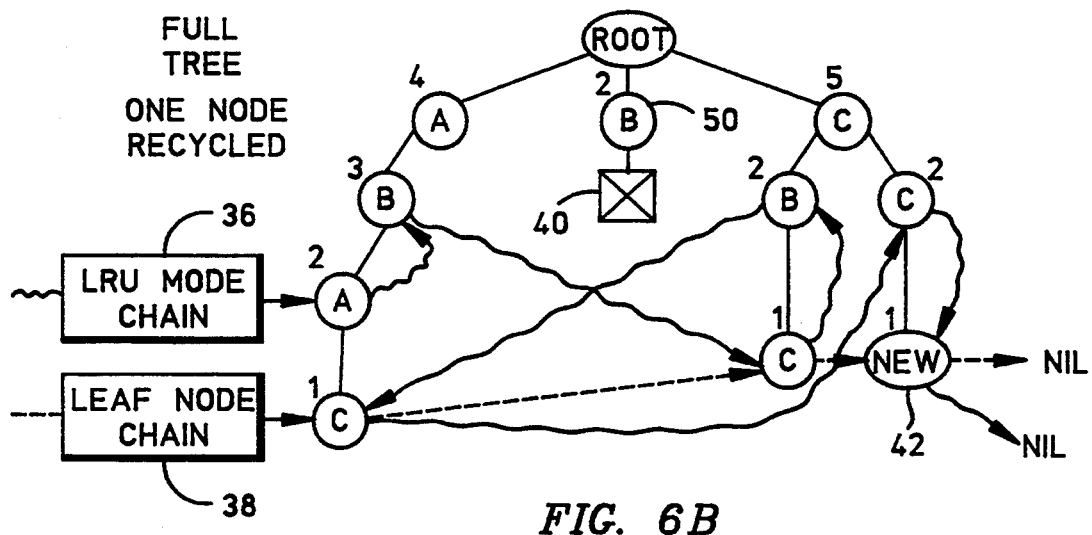

FIG. 6B shows the parse-tree from FIG. 6A following the recycling of one node 40 to permit the addition of a new node 42. A leaf node chain 38, containing all of the childless nodes in LRU node chain 36, is also constructed and is represented in FIG. 6A as a concatenation of nodes connected by dotted lines with arrows. For convenience in implementation, leaf node chain 38 should be in LRU order (not so illustrated). Node 40 must be removed upon addition of node 42 to avoid exceeding the full parse-tree count, postulated as ten nodes in this example. Node 40 is chosen according to the FLEAS algorithm by starting at node 44, representing the beginning of LRU node chain 36, and proceeding along chain 36 until the first leaf node having a use count value of 1 is located. In this example, node 44 has a use count value of 2 and is not selected. The next node in chain 36 is node 40, having a use value of 1, thereby making it the recycled node. If node 40 had exhibited a use count value greater than 1, the next node 46 in LRU node chain 36 is then tested and so forth. If the end of chain 36 at nil 48 is encountered without finding a node for recycling, the procedure is restarred at node 44 and the first node having the least count value encountered during the first pass is then selected for recycling.

Referring to FIG. 6B, after node 40 is replaced with new node 42 in the parse-tree, LRU node chain 36 is adjusted for the replacement by merely excising node 40 from the middle of chain 36, closing the gap, and adding node 42 at the end chain 36. After node 40 is eliminated, node 50 becomes a childless node but is not added to either chain 36 or 38 because it is an alphabet node linked directly to the root node and is marked as nonreplaceable (not shown).

Other node recycling procedures of this class considered by the inventors are found to be of more limited usefulness than FLEAS. The least frequently used (LFU) leaf node replacement policy is unacceptable for node recycling. This policy chooses the leaf node with the lowest use count value for recycling. Eventually every leaf in the tree acquires a use count of more than one except for the most recent leaf node, which will have a frequency of one. Because it is the most recently added to the tree, its removal for recycling upon addition of the next node leaves the parse-tree essentially unchanged for the remainder of the tree building phase except for a single node that varies continuously. This is a trivial result that does not justify additional data stream sampling.

The First Leaf Encountered, Annihilated (FLEA) procedure uses a circular queue of nodes available for elimination, including all nodes in the tree except for the initializing nodes. The FLEA method merely searches through the queue from its present point until it reaches a leaf node, which is immediately selected for recycling. This is less useful than the FLEAS method because it does not consider the LRU measure.

With the Least Weighted Leaf (LWL) method, a circular queue of nodes is also maintained, again excluding the initialization nodes. Each node has an assigned weight associated with it and, when a node is initially added to the tree, its weight is set at unity. Whenever the current scan through the input data passes through a node, that node's weight is incremented. When a node is required for recycling, this method searches through the queue and chooses the first leaf node having a weight of one. During the search, the weight is decremented for every other leaf node that is examined for selection but not selected.

The Probability Recycling (PR) method maintains a list of all current leaf nodes for the parse-tree and their associated use count values. The probability of any given leaf node being chosen for recycling is inversely proportional to its use count values. This probability is given as C/F where F is the use count value of the leaf node and C is a normalization constant equal to the reciprocal of the sum of the use count values for all leaf nodes. A random number is then used to select a leaf node for recycling.

Pane-Tree Reduction Through Leaf-Node Combination

To fully exploit the hardware based dictionary architecture, the parse-tree can be configured with more than one source symbol per node. The alternative approach is to construct a parse-tree having one source symbol per node in the usual manner and then combine selected nodes upon completion of the tree. Alternatively, a combination of the two strategies may be employed in building an efficient parse-tree.

The hardware dictionary architecture preferred for the DB2 example discussed herein permits three types of entries: (a) childless nodes can contain from one to five source symbol characters; (b) single-child parent nodes can contain from one to five source-symbol characters; and (c) parent nodes having more than one child can contain from one to two source symbol characters. This hardware configuration limits most parent nodes to two source symbols. Thus, exploitation of the larger capacity of leaf and single child parent nodes during tree construction is generally not useful because it might entail eliminating characters from leaf-nodes before growing new progeny nodes. Accordingly, it is preferred to build the tree with one character per node until exhaustion of the input data stream.

Figure 5A:
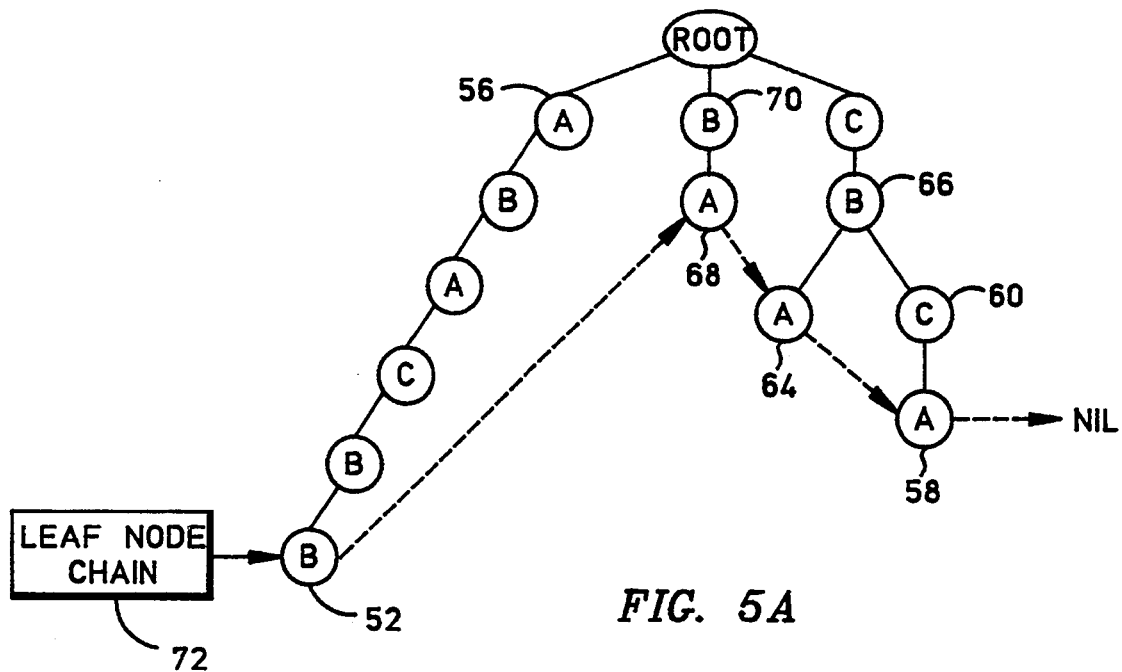
FIGS. 5A-B, illustrates the node combining method of this invention.
Figure 5B:
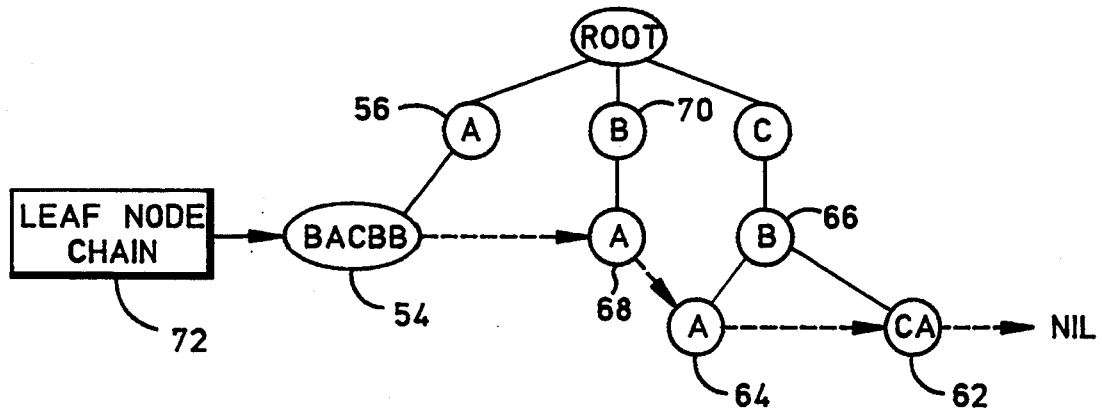

FIGS. 5A-5B illustrate the method preferred for node combination. FIG. 5A shows a parse-tree following exhaustion of the input data stream. Beginning with leaf node 52, the child is combined with parent to form a source symbol string including both symbols initially associated with child and parent nodes. This upward combination ends when one of several conditions is fulfilled as can be appreciated by referring to FIG. 5B. Node 54 represents a combination of five original nodes from FIG. 5A and cannot be upwardly combined with alphabet node 56 without exceeding the length limit specified for leaf-nodes of five source symbols. Referring again to FIG. 5A, node 58 is combined with node 60 to form node 62 in FIG. 5B. Node 64 cannot be combined with node 66 because node 66 has more than one child. Node 68 may not be combined with node 70 because node 70 is an alphabet node that is marked as nonreplaceable (not shown). Upon combination of the leaf nodes with their single-child parents, leaf node chain 72 is readjusted to include the new multiple source symbol nodes. The inventors considered an alternative method whereby the original parse-tree is constructed with two characters per node, thereby modifying the Ziv-Lempel procedure. Because the hardware configuration supports no less than two characters at any node, this method also avoids a requirement for a procedure for splitting nodes during tree construct/on. However, this alternative method does not exploit the additional capacity for up to five source symbols at each leaf node and each single-child parent node.

A third method combines the features of both of these alternate methods. A parse-tree can be built with two symbols per node. Once the input data is exhausted, the one to two symbol leaf nodes are then combined upward until encountering a parent node having more than one child. This results in a dictionary having two symbols per parent node and from one to five symbols per leaf node. This method best exploits the available hardware constraints, but, for the purposes of a general dictionary construction method applicable to a variety of hardware configurations, the inventors prefer the initial method whereby the parse-tree is constructed with single source-symbol nodes and then compacted I through the use of the leaf-node combining technique discussed above in connection with FIGS. 5A-5B.

Parse-Tree Reduction Through Leaf-Node Pruning

FIGS. 7A-7C illustrate the key method of this invention for overbuilding a parse-tree initially to extract as much compression efficiency as possible from the input data stream and then combining and/or pruning the parse-tree until it's small enough to fit into the limited storage available for it. Final dictionary storage space is more constrained than the intermediate memory available during tree construction. By the method of this invention, the tree is built to N nodes initially and then reduced to N/a nodes to permit the final dictionary to be stored in the available space. The DB2 example discussed above assigns values so that $N=16K$ and $N/a=4K$. The method of this invention is useful for any desired values for numbers of nodes N and contraction ratio a. This technique results from the observation that the compression efficiency of the pruned tree is unexpectedly superior to the compression efficiency of a parse-tree limited initially to the pruned size.

Parse-tree pruning is accomplished by establishing an initial threshold for the use count value, such as one and the leaf-node chain is constructed. Leaf-node chain 38 is then traversed sequentially from the beginning and every leaf node encountered with a use count value equal to the predetermined threshold value is pruned (eliminated). After the end of the leaf chain is contacted at nil 72 (FIG. 7A), the use count value threshold is incremented by one and the pruning process continues from the beginning of leaf node chain 38 in a second pass. This iterative process continues until the tree size is less than or equal to the desired predetermined plurality of nodes.

The following pseudocode routines in Tables 1 and 2 can be used to implement the tree-pruning procedure. The two pseudocode routines differ only in that Table 1 initiates leaf node combination at the beginning of each pass through leaf node chain 38 where Table 2 invokes leaf node combination only once.

TABLE 1

```
f = 1
Do While (number nodes > desired tree size)
    Get Next Leaf Node
    Combine Leaf Nodes Upward
    Prune Nodes with Use Count = f while number nodes >
    desired size
    Inc f
Enddo
```

TABLE 2

```
f = 1
Combine Leaf Nodes Upward
Do While (number nodes > desired tree size)
    Get Next Leaf Node
    Prune Nodes with Use Count = f while number nodes >
    desired size
    Inc f
Enddo
```

Referring to FIGS. 7A-7B, the leaf node combination procedure discussed above in connection with FIGS. 5A-5B is used to create node 74 representing source symbol string ACB and node 76 representing; source symbol string CA. Leaf node chain 38 is readjusted to add these combination nodes to leaf-node chain 38. The LRU chain is not shown in FIGS. 7A-7C and is not used in the pruning process.

In FIG. 7B, the first pruning step starts at node 74 and proceeds along leaf node chain 38, illustrated as a concatenation of dotted arrows, until it encounters the first occurrence of a use count value of one at node 78. Node 78 is immediately pruned as is node 80 having the same use count value. No other nodes are pruned in the first pass because nil 72 is reached without encountering another use count value of unity. The resulting pruned tree having nine nodes is shown in FIG. 7C.

FIG. 7C also shows the leaf node chain 38 revisions necessitated by the pruning of nodes 78 and 80. The next pruning pass, if any, starts at node 74 and selects all nodes having a use count value of two because the use count value threshold is incremented by one preparatory to another pass through leaf node chain 38. Thus, as shown in FIG. 7C, the next pass selects nodes 82, 84 and 76 for elimination, thereby reducing the parse-tree size to six nodes. Node 86 is an alphabet node marked for retention and is therefore ignored although it has a use count value of two. The LRU node chain used for leaf-node recycling as discussed above in connection with FIGS. 6A–6B is not used for the node combining and/or node pruning method of this invention.

The Parse-Tree Transformation Method

The parse-tree generated by the method discussed above is used to build the encoding and decoding dictionaries needed for the data compression and decompression operations. The procedure for building these dictionaries is recursive in nature and somewhat similar to a pre-order traversal procedure. The method of this invention treats each sibling node list as a node and proceeds down to the leaf nodes while building parent and sibling descriptors for the compression dictionary. Every node in the parse-tree must be represented by a dictionary entry. The first source symbol in the node is represented in the node's parent entry. All remaining source symbols in that node appear in the node's entry.

The dictionary format requires that all child node entries from a given parent node be contiguously stored in the compression dictionary. Thus, this rule dictates the order in which the parse-tree must be traversed during transformation. Traversal must move across the sibling node list for each parent node and then downward toward the leaf nodes. This is similar to a Pre-Order Tree Traversal but at each node the sibling node list is processed entirely. Once the entire parse-tree has been traversed, the compression dictionary is completed for use by the hardware-based compression utility.

Similarly, the same parse-tree is transformed into the decoding expansion dictionary. Considering the parse-tree example in FIG. 7B, the child node list from the ROOT node is first traversed. This creates a parent entry for node 88, 86 and 90. Next, the child list of node 88 is traversed to form one parent entry for node 92. Finally, the child list for node 92 is traversed to form two parent entries for node 74 and 82. Since this exhausts the subtrees below node 88, the next procedure continues with node 86, generating two parent trees for nodes 78 and 80. Since this exhausts the progeny of node 86, node 90 is next treated in a similar manner to create two parent entries, one of which also creates a single parent entry for node 84. The parse-tree is now represented by dictionary entries. The resulting dictionaries are then stored in computer memory for access by computer-based compression and decompression utilities.

The invention may be practiced in the form of computer-implemented routines provided in the data manager component of a relational database system such as the IBM DB2 product. As shown, the invention is executable on a digital computer of the type exemplified by the Enterprise System 9000 series of computers, running under a Multiple Virtual Storage (MVS)-type operating system, available from IBM Corporation, Armonk, New York.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. In a computer-implemented system for compressing input data consisting of sequences of source symbols selected from a source alphabet to form output data consisting of sequences of code symbols selected from a code alphabet according to a static dictionary stored in memory, said dictionary representing a static parse-tree having nodes representing said code symbols, said nodes being linked into paths representing said source symbol sequences, a method for creating said static dictionary comprising the steps of:
    (a) repeatedly performing the steps of
        (a.1) determining a source symbol sequence from said input data,
        (a.2) adding at least one node to said parse-tree responsive to said source symbol sequence, and
        (a.3) assigning a use count value to said at least one node responsive to the number of said source symbol sequence occurrences; and
    (b) reducing said parse-tree to a first predetermined plurality of nodes by repeatedly deleting from said parse-tree one or more childless nodes having a use count value less than a predetermined use count value threshold.

2. The method of claim 1 wherein said reducing step (b) comprises the additional step of:
    (b.1) combining with its parent node at least one childless node having a single-child parent node for which said use count differs by no more than one from said use count value for said at least one childless node, thereby forming a new childless node.

3. In a computer-implemented system for compressing input data arranged in a data stream of one or more records consisting of sequences of source symbols selected from a source alphabet to form output data consisting of sequences of code symbols selected from a code alphabet according to a static dictionary stored in a memory, said dictionary representing a static parse-tree having nodes representing said code symbols, said nodes being linked into paths representing said source symbol sequences, a method for creating said static dictionary comprising the steps of:
    (a) initializing a parse-tree with a plurality of said paths representing a set of said source symbol strings, each said path having at least one node with a unity use count value;.
    (b) setting a current input pointer at the beginning of said data stream; performing the steps of
        (c.1) determining the longest said source symbol sequence S, represented by a path P in said parse-tree, that matches a current said source symbol sequence in said data stream beginning at said current input pointer,
        (c.2) incrementing said use count value for all nodes in said path P,
        (c.3) adding a new node N having a unity use count value to the end of said path P to form a new path P' representing a new source symbol sequence S' consisting of said string S extended by at least one immediately subsequent source symbol in said data stream, and (c.4) advancing said current input pointer to immediately after said sequence S' in said data stream;

(s) if said parse-tree contains less than a first predetermined plurality of nodes, repeating said performing step (c);

(e) combining with its parent node one or more child nodes in said parse-tree, said child nodes each having a single-child parent node for which said use count value differs by no more than one from said use count value for each child node, thereby forming one or more new leaf nodes;

(f) assembling said nodes with the associated said paths to form said static dictionary; and (g) storing said static dictionary in said memory.

4. The method of claim 3 further comprising the steps of:

(e.1) initializing a use count value threshold to unity;

(e.2) performing the steps of (e.2.1) deleting each said childless node having a use count value less than or equal to said use count value threshold, and (e.2.2) incrementing said use count value threshold; and (e.3) if said parse-tree contains more than a second predetermined plurality of said nodes, repeating said performing step (e.2).

5. The method of claim 3 further comprising the steps of:

(e.1) creating a leaf chain by sequentially linking each childless node in said parse tree;

(e.2) combining with its parent node one or more child nodes in said leaf chain, said child nodes each having a single-child parent node for which said use count value differs by no more than one from said use count value for said each child node, thereby forming one or more new leaf nodes;

(e.3) adding said new leaf node to said leaf chain;

(e.4) repeating said combining step (e.2) and adding step (e.3) until no more said new nodes are formed;

(e.5) initializing a use count value threshold to unity;

(e.6) performing the steps of (e.6.1) deleting each said leaf node having a use count value less than or equal to said use count value threshold, and (e.6.2) incrementing said use count value threshold; and (e.7) if said parse-tree contains more than a second predetermined plurality of said nodes, repeating said performing step (e.6).

6. In a computer-implemented system for compressing input data arranged in a data stream of one or more records consisting of sequences of source symbols selected from a source alphabet to form output data consisting of sequences of code symbols selected from a code alphabet according to a static dictionary stored in a memory, said dictionary representing a static parse-tree having nodes representing said code symbols, said nodes being Linked into paths representing said source symbol sequences, a method for creating said static dictionary comprising the steps of:

(a) initializing a parse-tree with a plurality of said paths representing a set of said source symbol strings, each said path having at least one node with a unity use count value;

(b) setting a current input pointer at the beginning of said data stream;

(c) until said data stream is exhausted, repeatedly performing the steps of:

(c.1) determining the longest said source symbol sequence S, represented by a path P in said parse-tree, that matches a current said source symbol sequence in said data stream beginning at said current input pointer, (c.2) incrementing said use count value for all nodes in said path P, (c.3) if said sequence S is not the final sequence in a record, adding a new node N having a unity use count value to said path P to form a new path P' representing a new source symbol sequence S' consisting of said sequence S extended by at least one immediately subsequent said source symbol in said data stream, (c.4) linking said new node N to the end of a LRU chain, (c.5) advancing said current input pointer to the end of said sequence S' in said data stream, and (c.6) performing the steps of (e.6.1) initializing a use count value threshold to a fourth predetermined value, and (e.6.2) discarding from said LRU chain one said node whose use count value does not exceed said use count value threshold;

(d) assembling said nodes with the associated said paths to form said static dictionary; and (e) storing said static dictionary in said memory.

7. The method in claim 6 wherein said data stream is organized as a series of database records.

8. The method of claim 7 wherein said database records are organized in accordance with definitions for a NULL string and one or more DEFAULT strings and wherein said initializing step (a) comprises the additional step of:

(a.1) initializing said parse-tree with a second plurality of nodes forming one or more said paths, each said path representing one of said NULL and DEFAULT source symbol string definitions.

9. The method of claim 9 wherein said linking step (c.4) comprises the steps of:

(c.4.1) creating a leaf chain by sequentially linking each childless node in said LRU chain; and (c.4.2) combining with its parent node one or more child nodes in said leaf chain, said child nodes each having a single-child parent node for which said use count value differs by no more than one from said use count value for said each child node, thereby forming one or more new leaf nodes.

10. A computer-implemented system for compressing input data arranged in a data stream of one or more records consisting of sequences of source symbols selected from a source alphabet to form output data consisting of sequences of code symbols selected from a code alphabet according to a static dictionary stored in a memory, said dictionary representing a static parse-tree having nodes representing said code symbols, said nodes being linked into paths representing said source symbol sequences, said system comprising primer means for initializing a parse-tree with a plurality of said paths representing a set of said source symbol strings, each said path having at least one node with a unity use count value;

pointer means for setting a current input pointer at the beginning of said data stream;

comparator means for determining the longest said source symbol sequence S, represented by a path P in said parse-tree, that matches a current said source symbol sequence in said data stream beginning at said current input pointer;

adder means for incrementing said use count value for all nodes in said path P;

extender means for adding a new node N having a unity use count value to the end of said path P to form a new path P' representing a new source symbol sequence S' consisting of said string S extended by at least one immediately subsequent source symbol in said data stream;

register means for advancing said current input pointer to immediately after said sequence S' in said data stream;

counter means for determining when the number of said nodes in said parse-tree exceeds a first predetermined plurality of nodes;

first linker means for sequentially linking each childless node in said parse tree to form a leaf node chain;

node combiner means for combining with its parent node a child node in said leaf node chain having a single-child parent node for which said use count value differs by no more than one from said use count value for said child node, thereby forming a new leaf node; transformer means for assembling said nodes with the associated said paths to form said static dictionary; and storage means for storing said static dictionary in said memory.

11. The computer implemented system of claim 10 further comprising:

node pruner means for deleting each said node in said leaf node chain having a use count value less than or equal to a predetermined use count value threshold.

12. The computer-implemented system of claim 10 further comprising:

linker means for adding said new node N to the end of a LRU chain; and node recycler means for discarding from said LRU chain one said node whose use count value does not exceed a predetermined use count value threshold.

* * * * *

UNITED STATES PATENT AND TRADEMARK OFFICE
CERTIFICATE OF CORRECTION

PATENT NO. : 5,412,384
DATED : May 2, 1995
INVENTOR(S) : Chang et al

It is certified that error appears in the above-indentified patent and that said Letters Patent is hereby corrected as shown below:

Col. 3, line 34, replace "rabies" with --tables--; and
line 44, replace "Lemnel" with --Lempel--.

Col. 15, line 3, replace "(s)" with --(d)--; and
line 62, replace "Linked" with --linked--.

Col. 16, line 24, replace "(e.6.1)" with --(c.6.1)--; and
line 26, replace "(e.6.2)" with --(c.6.2)--.

Signed and Sealed this

Twenty-fifth Day of July, 1995

Attest:

BRUCE LEHMAN

*Attesting Officer*     *Commissioner of Patents and Trademarks*